(12) United States Patent
Powell et al.

(10) Patent No.: US 6,184,536 B1
(45) Date of Patent: Feb. 6, 2001

(54) ION IMPLANTATION PROCESS

(75) Inventors: Martin J. Powell, Horley; Carl Glasse, Redhill; Barry F. Martin, Burgess Hill, all of (GB)

(73) Assignee: U.S. Philips Corporation, New York, NY (US)

( * ) Notice: Under 35 U.S.C. 154(b), the term of this patent shall be extended for 0 days.

(21) Appl. No.: 09/208,507

(22) Filed: Dec. 9, 1998

(30) Foreign Application Priority Data

Dec. 11, 1997 (GB) .................................................. 9726191

(51) Int. Cl.[7] ............................ H01J 49/26; H01J 37/317
(52) U.S. Cl. ................... 250/492.21; 250/492.1; 250/492.2; 250/423 R
(58) Field of Search .......................... 250/492.21, 492.1, 250/492.2, 423 R

(56) References Cited

U.S. PATENT DOCUMENTS

| 4,533,831 | * | 8/1985 | Itoh et al. ........................ 250/492.2 |
| 4,881,817 | | 11/1989 | Kim et al. ............................ 396/350 |
| 4,904,616 | * | 2/1990 | Bohling et al. ....................... 437/81 |

* cited by examiner

Primary Examiner—Bruce C. Anderson
Assistant Examiner—Nikita Wells
(74) Attorney, Agent, or Firm—Aaron Waxler

(57) ABSTRACT

An ion implantation process comprises performing mass separation of ions from an ionised source of phosphorus so as to select the $P_2$ ions and reject phosphorus hydride ion species. The $P_2$ ions are injected into a semiconductor substrate. The rejection of phosphorus hydride ions species is facilitated because there are no such species adjacent (in terms of effective mass) the $P_2$ ion species. The use of the $P_2$ ion species also improves the implantation process for shallow implantation depths.

5 Claims, 1 Drawing Sheet

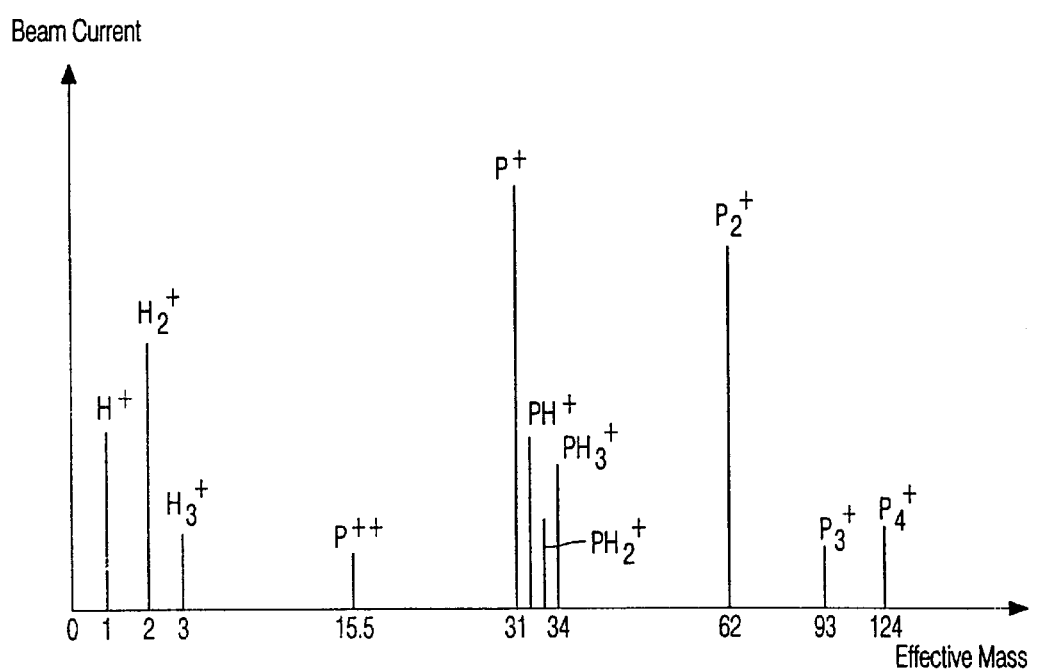

ION IMPLANTATION PROCESS

BACKGROUND OF THE INVENTION

This invention relates to an ion implantation process, particularly ion implantation of phosphorus into a semiconductor substrate using ion implanting equipment having mass separation.

Ion implantation is an important technique used in the manufacture of semiconductor devices. Ion shower systems are commonly used for implantation into a larger area of semiconductor material. Alternatively, an ion implantation apparatus is known using mass-analysed ion implantation, which effects selection by mass of ions desired for implantation into the semiconductor substrate. A mass spectrometer typically performs the mass separation using a static magnetic field generated by an electron magnet, wherein selected ion species are obtained by controlling the electric current in the magnetic coil so that the selected ion species pass through a resolving slit. Mass separation is suitable for narrow ion implantation beams, which can be scanned to cover a large area semiconductor layer.

One common donor atom implanted into semiconductor material to create an n-type doped semiconductor is phosphorus, and it is known to use an ion source of phosphine ($PH_3$) for phosphorus doping. A problem with conventional ion shower implantation is that a number of ion species are implanted into the semiconductor substrate during the implantation process. Mass separation systems may also not have the resolution to discriminate between individual ion species. For example, phosphorus hydride ions (present in ionised phosphine) have very similar atomic masses to phosphorus ions, so that accurate mass analysis is required in order to separate the phosphorus ion species. Implantation of some hydrides may not be considered to be a problem, particularly in the case of poly-silicon or single crystal silicon semiconductor substrates. However, for doping of amorphous silicon layers the effects of hydride impurities is more pronounced. It has been recognised that implantation of hydrogen ions should be avoided, and the ion implantation system described in U.S. Pat. No. 4,533,831 seeks to avoid implantation of hydrogen ions. This is achieved generally by separating heavier ions from lighter ions. U.S. Pat. No. 4,533,831 does not eliminate the implantation of phosphorus hydride ions.

SUMMARY OF THE INVENTION

According to the present invention, there is provided an ion implantation process comprising performing mass separation of ions from an ionised source of phosphorus so as to select $P_2$ ions and reject phosphorus hydride ion species and implanting the $P_2$ ions into a semiconductor material.

The implantation process of the invention selects $P_2$ ions. When beam current analysis is performed on the ion species derived from a phosphine ($PH_3$) ion source, it is revealed that there are no hydride ions surrounding (on the mass axis) the $P_2$ ion species. Consequently, a rough mass separation procedure may enable efficient separation of the $P_2$ ions, with the result that the ion implantation process can be controlled to eliminate any hydrogen implantation into the semiconductor substrate. The invention is therefore particularly suited to the use of gaseous phosphine as the ion source and which is readily available and already conventionally used in phosphorus implantation procedures.

The invention provides particular advantages for implantation into amorphous silicon, because it has been found that the introduction even of hydride ions into amorphous silicon significantly deteriorates the properties of the amorphous silicon semiconductor devices.

The invention also provides a method of manufacturing thin film transistors using an ion implantation process of the invention. In particular, the ion implantation process is used to define drain and source regions of the thin film transistors in an amorphous silicon layer.

BRIEF DESCRIPTION OF THE DRAWING

The invention will now be described by way of example, and with reference to the figure which shows the ion species occurring in a gaseous phosphine ion source.

DESCRIPTION OF THE PREFERRED EMBODIMENTS

The invention relates to ion implantation for doping of phosphorus into a semiconductor substrate, so as to produce n-type doped semiconductor material. A known source of phosphorus ions is phosphine ($PH_3$), and ionisation of a phosphine source results in the ion species shown in FIG. 1, which plots the beam current of the particular species against the effective mass (atomic mass divided by charge). A non-linear scale is used for the effective mass axis, and no values for beam current are given the height of the peaks of the Figure are for comparison purposes only. The ion species of greatest interest in FIG. 1 are the $P^+$, and $P_2^+$ ion species, although phosphorus hydride ions ($PH^+$, $PH_2^+$, $PH_3^+$) are also present as well as well as hydrogen ions ($H^+$, $H_2^+$, $H_3^+$) and other phosphorus species ($P_3^+$, $P_4^+$).

In one proposed mass separation ion implantation process, the P+ ion is selected using mass separation, and all other ion species are rejected. For this purpose, the mass separation equipment must be capable of distinguishing between a $PH^+$ ion (atomic mass 32) and a $P^+$ ion (atomic mass 31). Alternatively, an ion shower system results in doping of all ion species without mass selection.

It has been recognised in U.S. Pat. No. 4,533,831 that the implantation of $H^+$ ions should be avoided, particularly as hydrogen ion implantation has an adverse influence on the characteristics on the solar batteries described in U.S. Pat. No. 4,533,831. It has been found that the implantation of phosphorus hydride ion species, as well as the implantation of hydrogen ions, should be avoided, particularly for amorphous silicon semiconductor devices. The invention resides in the mass selection of $P_2^+$ ions from the impurity source. As can be seen from the Figure, the mass selection of $P_2^+$ ions can be performed using rough mass separation since there are no hydride ions in close proximity to the $P_2$ ion species.

The mass separation may be performed by conventional techniques, and a conventional mass-analysis ion implantation apparatus employing a mass spectrometer and producing a narrow ion implantation beam for scanning over a semiconductor material may be controlled to perform the implantation process of the invention. The details of such an apparatus will not be described in this description, as those skilled in the art of silicon processing will be aware of the available alternatives.

The section of $P_2$ ions also enables lower energy implantation to be performed by a given ion implantation apparatus. For example, a conventional ion implantation apparatus may operate at 20 kV, and the efficiency of the apparatus will drop significantly if the operating voltage is greatly reduced. The use of the single-charge $P_2^+$ phosphorus ion pair enables the implantation depth to be reduced so that the apparatus is operating in the same manner as a 10 kV implantation process selecting individual P+ phosphorus ions. The reduced implantation depth is desirable for implantation of thin film semiconductor layers and may also prevent contamination of the substrate beneath the semiconductor layers. Thus, the implantation apparatus can operate at the optimum operating voltage for a reduced implant depth. Operation at the ideal operating voltage results in increased beam currents, and a consequent reduction in the implantation time required. In addition, as twice as many phosphorus donor atoms are implanted for a given number of charged ions, the implantation time is further reduced.

As explained above, the problem of hydrogen implantation is particularly significant for amorphous silicon semiconductor devices. Furthermore, the doping concentration required for the manufacture of amorphous silicon semiconductor devices is much greater than the doping requirement for polysilicon semiconductor devices. For example, a typical doping concentration for amorphous silicon TFTs is $10^{16}$ ions per cm$^2$, compared with $10^{12}$ to $10^{13}$ ions per cm$^2$ for poly-silicon. A possible reduction in the implantation time therefore becomes important, as well as the need to reduce the implantation of unwanted impurities.

Although the invention has been described with reference to a gaseous phosphine ion source, other ion sources may be considered, for example solid sources. In either case, the chemical reluctance of hydride ion formation in the vicinity of the $P_2$ ion species gives the advantage of simplified mass separation to obtain the isolated $P_2$ ions.

One particular application of the ion implantation described above is the manufacture of thin film transistors, and the ion implantation process is then particularly suited for defining drain and source regions of amorphous silicon thin film transistors.

What is claimed is:

1. An ion implantation process comprising;
    performing mass separation of ions from an ionised source of phosphorus so as to select $P_2$ ions and reject phosphorus hydride ion species; and
    implanting the $P_2$ ions into a semiconductor material.
2. A process as claimed in claim 1, wherein the ionised source of phosphorus is gaseous phosphine.
3. A process as claimed in claim 1, wherein the semiconductor material comprises an amorphous silicon layer.
4. A method of manufacturing thin film transistors using an ion implantation process as claimed in claim 1.
5. A method as claimed in claim 4, wherein the ion implantation process is used to define drain and source regions of the thin film transistors in an amorphous silicon layer.

* * * * *